US008294796B2

(12) United States Patent
Yamada (10) Patent No.: US 8,294,796 B2
(45) Date of Patent: Oct. 23, 2012

(54) IMAGE SENSOR

(75) Inventor: Daisuke Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 192 days.

(21) Appl. No.: 12/756,074

(22) Filed: Apr. 7, 2010

(65) Prior Publication Data
US 2010/0259668 A1    Oct. 14, 2010

(30) Foreign Application Priority Data

Apr. 10, 2009    (JP) .................................. 2009-095476

(51) Int. Cl.
*H04N 3/14*    (2006.01)
*H04N 5/225*    (2006.01)
(52) U.S. Cl. ........................................ 348/273; 348/340
(58) Field of Classification Search .................. 348/340, 348/333.08, 273; 257/233
See application file for complete search history.

(56) References Cited

U.S. PATENT DOCUMENTS

2007/0145422 A1* 6/2007 Park ............................... 257/233
2008/0251874 A1* 10/2008 Ishibe ........................... 257/432

FOREIGN PATENT DOCUMENTS

| JP | 2005-175430 A | | 6/2005 |
| JP | 2007-41555 | * | 2/2007 |
| JP | 2007-041555 A | | 2/2007 |

* cited by examiner

*Primary Examiner* — Tuan Ho
*Assistant Examiner* — Shahbaz Nazrul
(74) *Attorney, Agent, or Firm* — Canon U.S.A., Inc., IP Division (57) ABSTRACT

An image sensor including an photoelectric conversion portion; a microlens; and a filter layer between the photoelectric conversion portion and the microlens. The filter layer has a convex shape having a center of curvature on a side of the photoelectric conversion portion with respect to the filter layer and includes patterns that are arranged in a one-dimensional or two-dimensional period such that an angle from the center of curvature is fixed.

8 Claims, 10 Drawing Sheets

IMAGE SENSOR

BACKGROUND OF THE INVENTION

1. Field of the Invention

The present invention relates to an image sensor, and more particularly, to an image sensor including a filter layer having patterns that are periodically arranged in a convex shape.

2. Description of the Related Art

In recent years, image sensors in which a plurality of charge coupled devices (CCDs) or complementary metal oxide semiconductor (CMOS) devices is arranged in a two-dimensional pattern are used for a digital video camera or a digital still camera.

With increasing number of pixels included in such image sensors as described above, the size of each pixel has been reduced.

Here, a schematic structure of a conventional image sensor having a reduced pixel size as described above is described with reference to FIG. 10.

Figure 10:
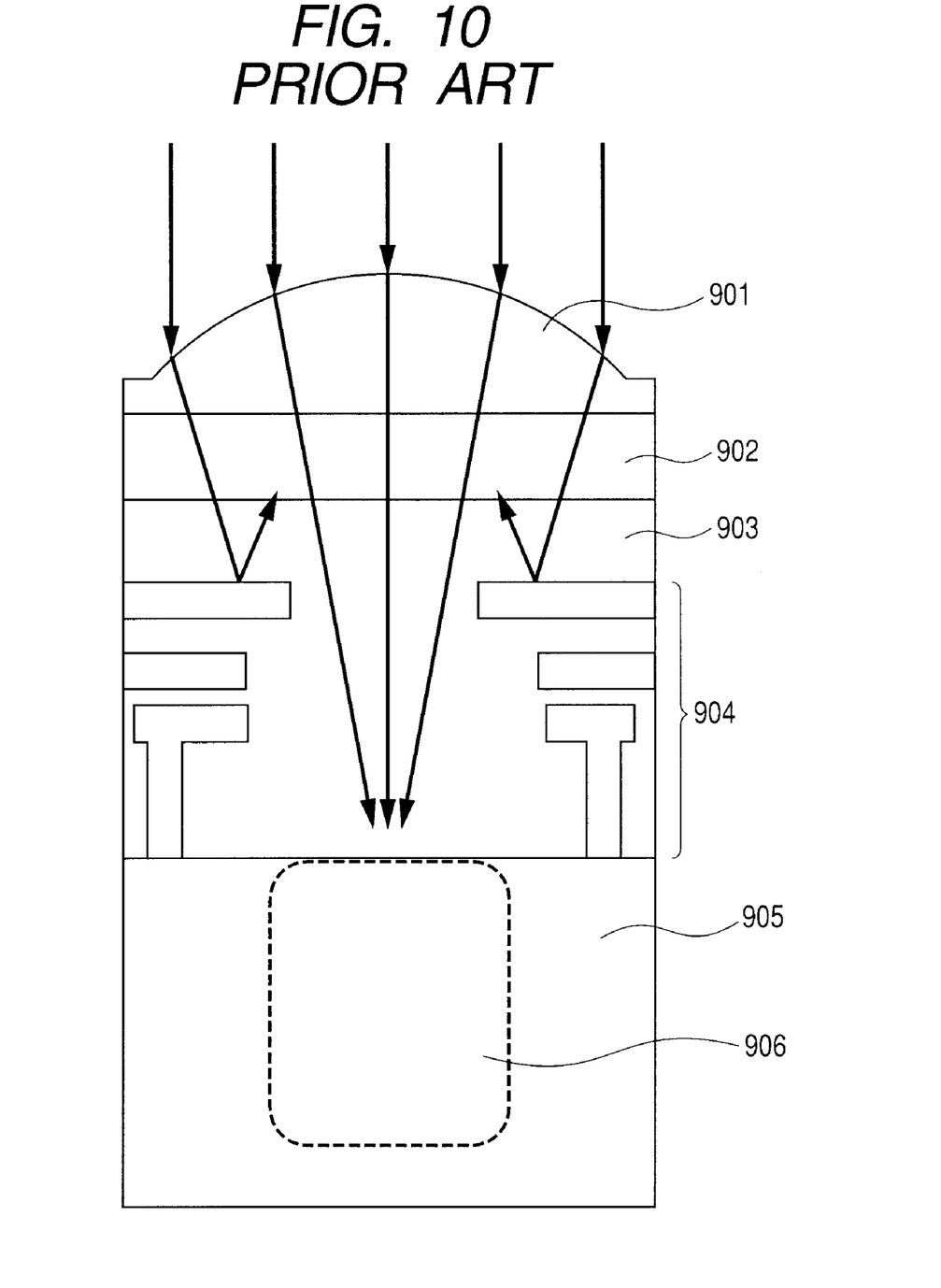
FIG. 10 is an explanatory cross sectional view illustrating a structure of a conventional image sensor.

In FIG. 10, the conventional image sensor includes a microlens 901, a color filter layer 902 having a planar shape, an interlayer insulating film 903, a wiring layer 904 and a semiconductor substrate 905 including an photoelectric conversion portion 906. It is known that the color filter layer 902 is normally manufactured by mixing a pigment or dye for each color into an acrylic-based resin.

When the pixel size is reduced, the proportion of the wiring layer 904 and the color filter layer 902, which are formed on the semiconductor substrate 905, is increased. As a result, the aspect ratio of the distance between the microlens 901 and the photoelectric conversion portion 906 to the pixel size is increased. Therefore, the light focusing rate with respect to the opening portion of the pixel is deteriorated.

Conventionally, in order to prevent the light focusing rate from being deteriorated even when the pixel size is reduced, it has been attempted to reduce the aspect ratio.

For example, a technique of changing a material of the wiring layer 904 from aluminum to copper to thereby thin thickness of the wiring layer has been employed.

In addition, as a technique of thinning thickness of the color filter layer 902, Japanese Patent Application Laid-Open No. 2005-175430 proposes a color filter layer in which film thickness of an absorbent material is controlled to thereby perform color separation.

In addition, Japanese Patent Application Laid-Open No. 2007-41555 proposes a thin film color filter using a sub-wavelength grating.

In the color filter using the sub-wavelength grating, the following resonance phenomenon is used.

That is, of the light entering the color filter using the sub-wavelength grating, light having a particular wavelength corresponding to the shape and the period of the sub-wavelength grating propagates inside the grating and causes multiple reflections, to thereby cause resonance.

The particular wavelength is selectively reflected due to this resonance. Accordingly, in principle, such characteristics that the reflectance is 100% and the transmittance is 0% can be obtained.

The color filter using the sub-wavelength grating is realized as a color filter by using the resonance phenomenon as described above.

However, the above-mentioned conventional image sensor has the following problems.

That is, in the color filter layer described in Japanese Patent Application Laid-Open No. 2005-175430, material dispersion characteristics of the same material are used to perform color separation, and hence color separation characteristics are insufficient. Therefore, excellent color reproduction characteristics of an image cannot be obtained.

In addition, the color filter using the sub-wavelength grating has a problem that the transmission spectrum changes according to the incident angle of the light.

When the color filter using the sub-wavelength grating is applied to the color filter layer 902 of the image sensor, as illustrated in FIG. 10, light which are refracted by the microlens 901 enter the color filter layer 902 at various angles.

Therefore, the color filter using the sub-wavelength grating in which the transmission spectrum changes according to the incident angle of the light has insufficient color separation characteristics. As a result, excellent color reproduction characteristics of an image cannot be obtained.

SUMMARY OF THE INVENTION

The present invention has been made in view of the above-mentioned problems, and therefore has an object to provide an image sensor that includes a thin film color filter and has excellent color reproduction characteristics of an image.

In an aspect of the invention, there is provided an image sensor comprising an photoelectric conversion portion; a microlens; and a filter layer between the photoelectric conversion portion and the microlens, wherein the filter layer has a convex shape having a center of curvature on a side of the photoelectric conversion portion with respect to the filter layer and includes patterns that are arranged in a one-dimensional or two-dimensional period such that an angle from the center of curvature is fixed.

According to the present invention, the image sensor that includes the thin film color filter and has the excellent color reproduction characteristics of an image can be realized.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The mode for carrying out the present invention is described based on the following embodiments.

It should be noted that, throughout all the drawings for describing the embodiments, components having the same function are denoted by the same reference symbols, and thus repetitive description thereof is omitted.

EMBODIMENTS

First Embodiment

Figure 1:
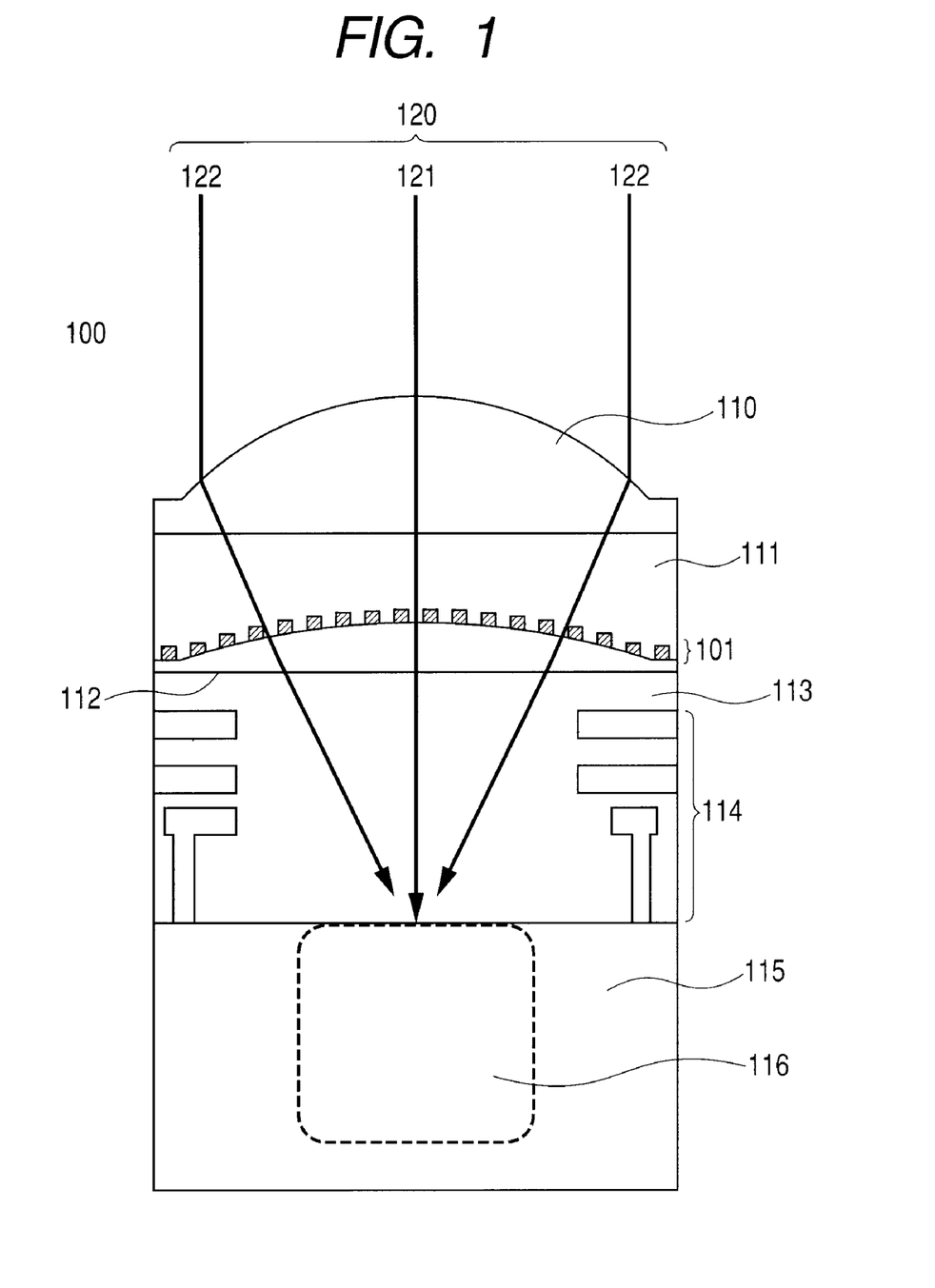
FIG. 1 is an explanatory cross sectional view illustrating a structure of an image sensor according to a first embodiment of the present invention.

With reference to FIG. 1, an image sensor according to a first embodiment, to which the present invention is applied, is described.

An image sensor 100 of this embodiment includes a filter layer between an photoelectric conversion portion and a microlens.

Specifically, as illustrated in FIG. 1, the image sensor 100 of this embodiment has a structure in which a microlens 110, a planarization layer 111, an insulating film 112 having a convex shape, an interlayer insulating film 113, a wiring layer or light shielding film 114 and a semiconductor substrate 115 including an photoelectric conversion portion 116 are provided in the stated order.

In addition, a color filter 101 constituting the above-mentioned filter layer is formed on the insulating film 112 having the convex shape which is provided on a light incident side with respect to the wiring layer 114.

Further, incident light 120 is refracted by the microlens 110, transmits through the color filter 101, and forms an image on a surface of the photoelectric conversion portion 116.

In this case, incident light 121 in the center of a pixel is perpendicularly incident on the center of the color filter 101. On the other hand, incident light 122 in the periphery of the pixel is obliquely incident on the periphery of the color filter 101.

Figure 2A:
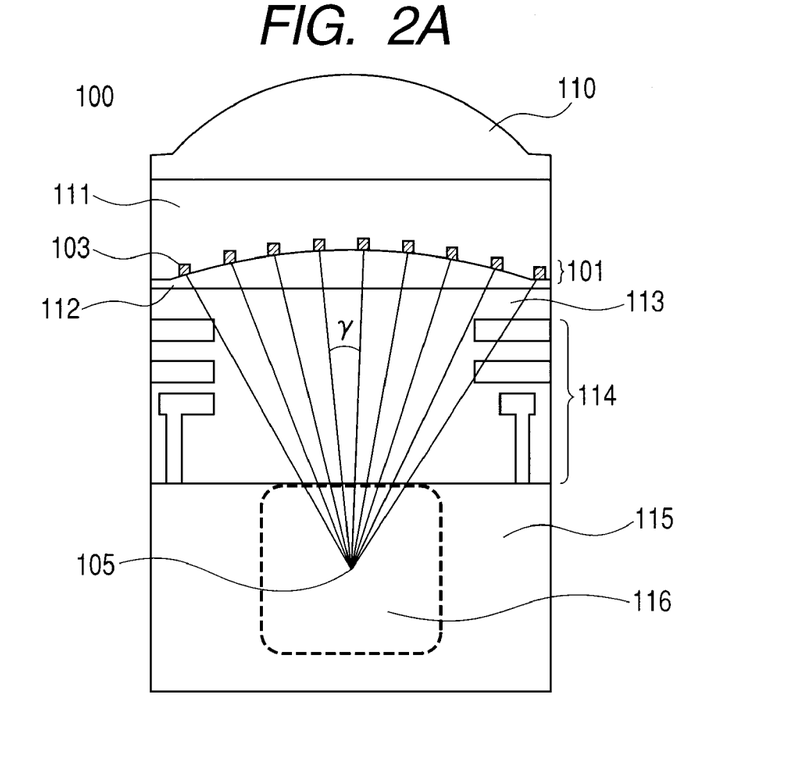
FIGS. 2A and 2B are explanatory views illustrating a structure of a color filter according to the first embodiment of the present invention.
Figure 2B:
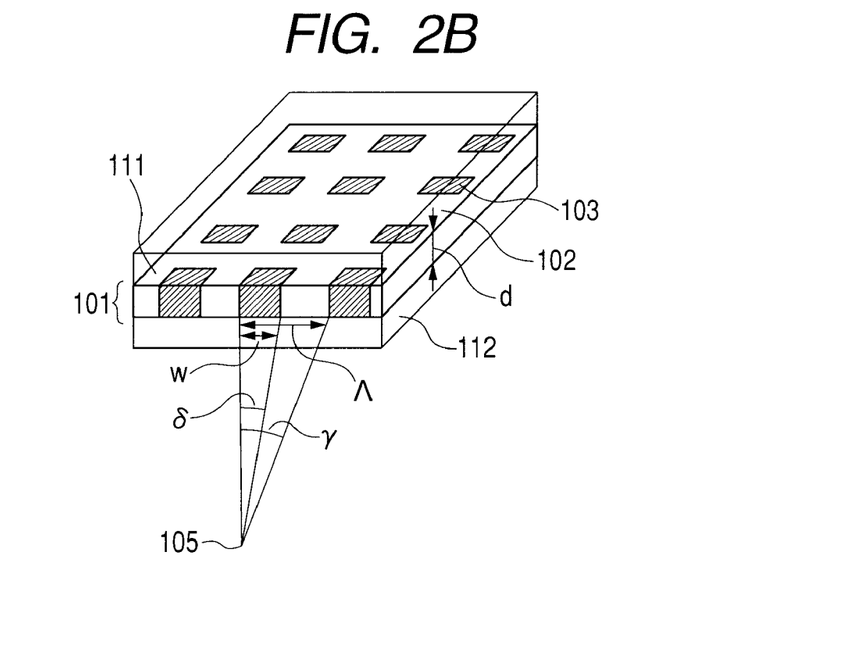

Next, with reference to FIGS. 2A and 2B, the color filter 101 according to this embodiment is described.

FIG. 2A is a cross sectional view illustrating the image sensor 100 including the color filter 101, and 2B is an enlarged perspective view illustrating the color filter 101.

The color filter 101 has the convex shape in which a center of curvature 105 is located on the photoelectric conversion portion side with respect to the color filter itself, and is formed of an insulating film 102 and patterns 103.

In addition, the patterns 103 are arranged in a two-dimensional square lattice pattern at a constant period angle γ from the center of curvature 105 of the color filter 101.

In addition, the patterns 103 are each formed so as to have a width corresponding to a pattern width angle δ from the center of curvature 105.

Assuming that a radius of curvature of the color filter is indicated by r, a lattice period Λ and a pattern width w of the color filter 101 are represented by Equation (1) and Equation (2).

$$\Lambda = r \cdot \gamma \quad (1)$$

$$w = r \cdot \delta \quad (2)$$

In this embodiment, the patterns 103 are arranged in the convex shape. Accordingly, an angle formed between the incident light 122 and a surface normal at a light incident position on the color filter 101 is smaller compared with the case where the color filter has the planar shape. As a result, the range of the angle at which the incident light 120 enters the color filter 101 can be reduced. Therefore, the color separation characteristics of the incident light 120 are improved, and the color reproduction characteristics of an image are also improved.

In addition, because the color filter of the present invention utilizes a resonance phenomenon, the color filter can be formed so as to have a small film thickness.

Hereinafter, description is made based on a numerical embodiment.

Figure 3A:
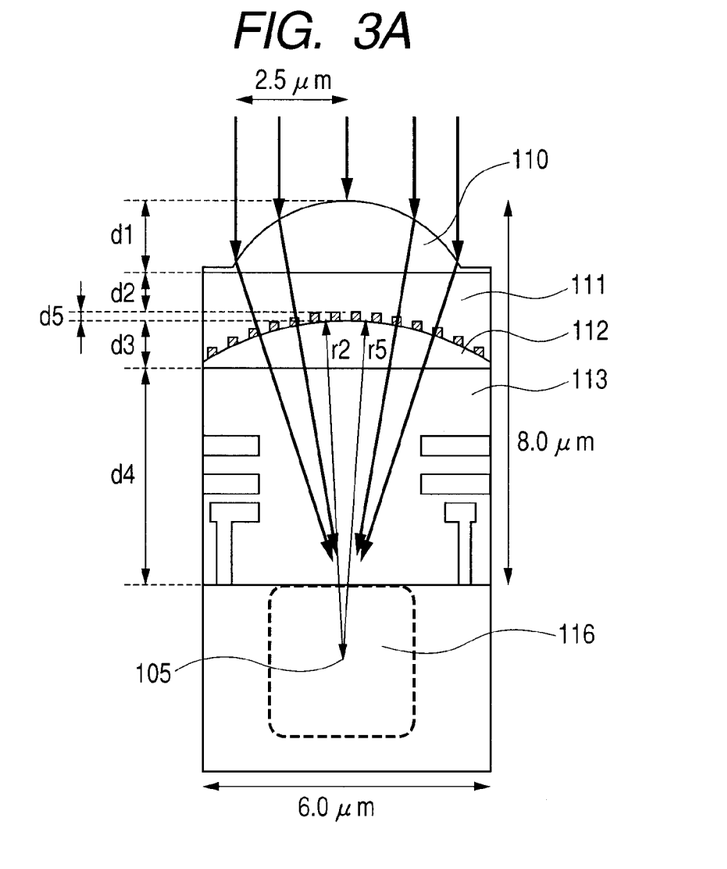
FIG. 3A is an explanatory cross sectional view illustrating the image sensor according to the first embodiment of the present invention.

With reference to FIG. 3A, the image sensor according to this embodiment is described. As illustrated in FIG. 3A, in the image sensor, the pixel size is 6.0 μm and the distance between the microlens 110 and the surface of the photoelectric conversion portion 116 is 8.0 μm.

Refractive indexes of the microlens 110, the planarization layer 111, the insulating film 112 having the convex shape, the interlayer insulating film 113 and the insulating film 102 are indicated by n1, n2, n3, n4 and n5, respectively. Film thicknesses of these members in the center of the image sensor are indicated by d1, d2, d3, d4 and d5, respectively. An insulating film made of a BPSG film or silicon oxide is used for these members.

The respective refractive indexes and the respective film thicknesses in this case according to this embodiment are shown in Table 1.

In addition, radii of curvature of the microlens 110, the insulating film 112 having the convex shape and the color filter 101, which are indicated by r1, r2 and r5, respectively, are shown in Table 2.

Figure 3B:
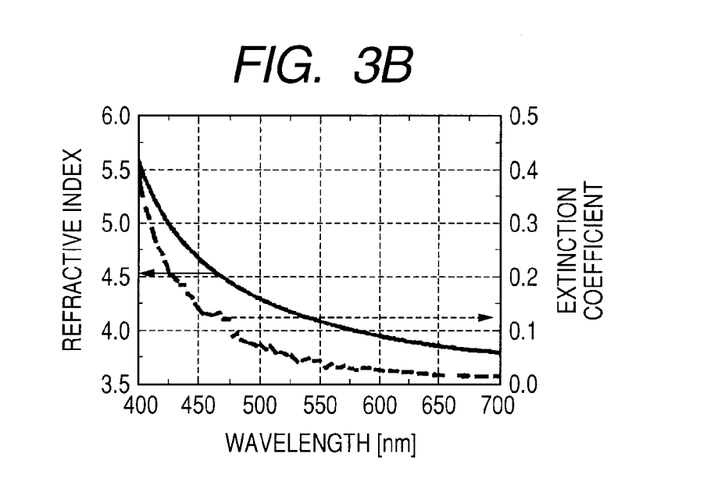
FIG. 3B is a graph showing material dispersion characteristics of a silicon in patterns forming the color filter, the material dispersion characteristics being expressed by refractive index and extinction coefficient.

In addition, the patterns 103 are each formed of silicon (Si) with a film thickness of 100 nm, and values shown in FIG. 3B are used for refractive index and extinction coefficient of each of the patterns 103.

TABLE 1

| | Refractive Index | | Film Thickness [μm] |
|---|---|---|---|
| n1 | 1.50 | d1 | 1.50 |
| n2 | 1.50 | d2 | 1.00 |
| n3 | 1.50 | d3 | 0.90 |
| n4 | 1.46 | d4 | 4.50 |
| n5 | 1.50 | d5 | 0.10 |

TABLE 2

| | Radius of Curvature [μm] |
|---|---|
| r1 | 2.71 |
| r2 | 5.52 |
| r5 | 5.62 |

In this embodiment, the period angle γ, the pattern width angle δ and a pattern thickness d are set to 0.0533 rad, 0.0409 rad and 100 nm, respectively, to thereby realize a green filter.

In this case, because the radius of curvature of the color filter is set to 5.62 μm, the lattice period Λ and the pattern width w of the color filter are 300 nm and 230 nm, respectively, according to Expression (1) and Expression (2) described above.

It should be noted that, in this embodiment, description is made of the green filter, but a red filter, a blue filter or a complementary color filter can be realized by changing pattern parameters or materials.

Figure 4A:
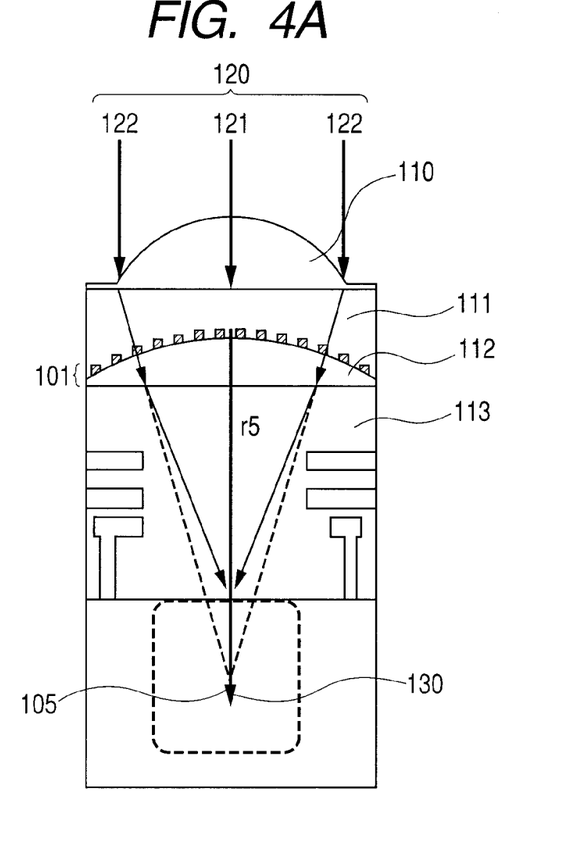
FIG. 4A is an explanatory cross sectional view illustrating the image sensor according to the first embodiment of the present invention.

In this embodiment, as illustrated in FIG. 4A, the image sensor is formed such that the center of curvature 105 of the color filter 101 is matched with a focal position 130 of the microlens 110.

Therefore, the direction of the incident light and the direction of the surface normal at the light incident position on the color filter 101 are matched with each other, so that the incident light 120 is perpendicularly incident on the color filter 101.

Figure 4B:
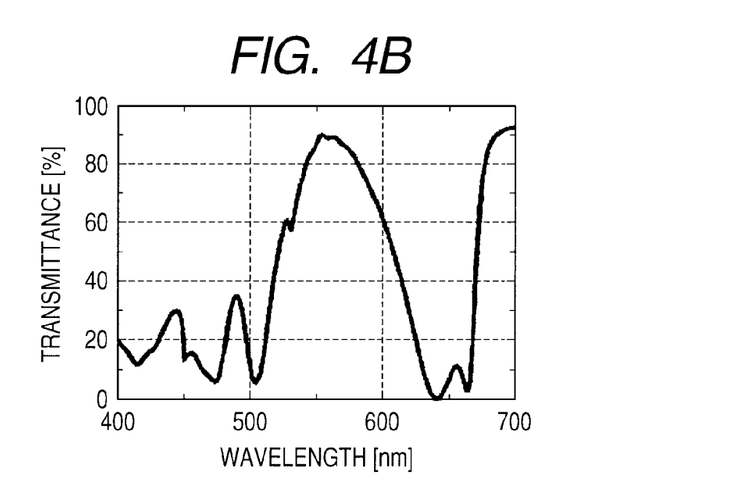
FIG. 4B is a graph showing a transmission spectrum of the color filter.

FIG. 4B shows the transmission spectrum in this case.

A light transmission characteristic of 90% or higher is obtained at a wavelength of 555 nm (green color), and a light transmission characteristic of 20% or lower is obtained in the vicinity of each of wavelengths of 450 nm (blue color) and 650 nm (red color).

Therefore, the color separation as the green color filter can be performed. It should be noted that the focal position 130 of the microlens 110 corresponds to an intersection point of extended lines of those light incident on the color filter 101 which originate from incident light refracted by the microlens 110.

Here, the case where the color filter 101 of this embodiment is structured to have the planar shape as in the above-mentioned conventional example is discussed.

In this structure, the incident light which is refracted by the microlens 110 is obliquely incident on the color filter.

As a result of ray tracing, for example, the light which is incident on the microlens 110 at a position 2.5 μm away from the center of the pixel is then incident on the color filter at an angle of 17.6 degrees and a position 1.73 μm away with respect to the central axis of the color filter.

In addition, the light which is incident on the microlens 110 at a position 1.5 μm away from the center of the pixel is then incident on the color filter at an angle of 10.6 degrees and a position 1.04 μm away with respect to the central axis of the color filter.

In addition, the light which is incident on the microlens 110 at a position 0.5 μm away from the center of the pixel is then incident on the color filter at an angle of 3.53 degrees and a position 0.346 μm away with respect to the central axis of the color filter.

Figure 5A:
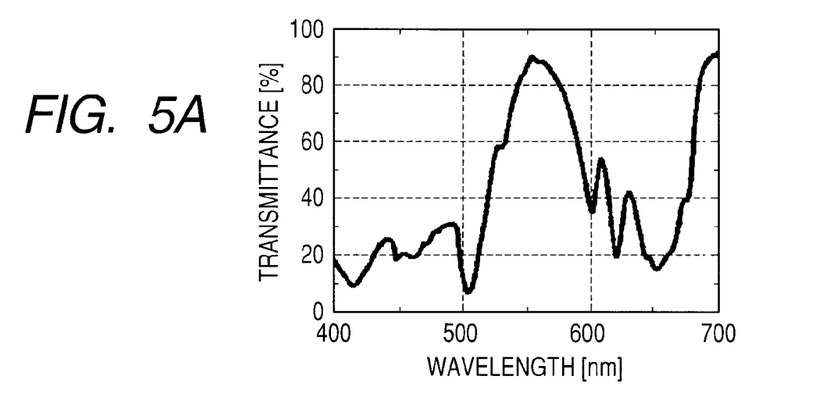
FIGS. 5A, 5B and 5C are graphs each showing the transmission spectrum of the color filter according to the first embodiment of the present invention.
Figure 5B:
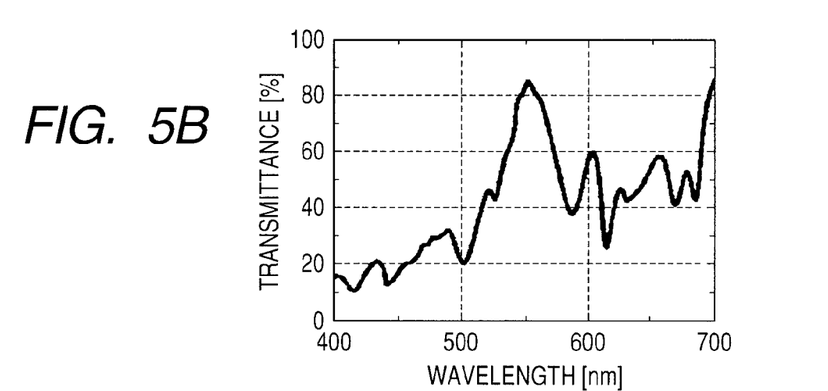
Figure 5C:
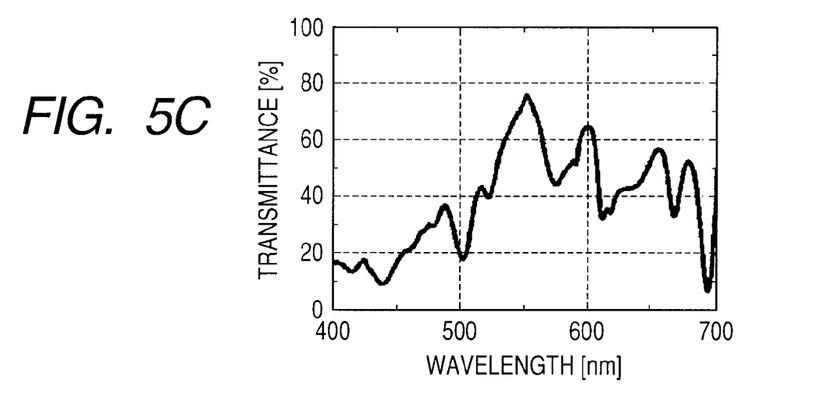

FIGS. 5A, 5B and 5C show the transmission spectrums when light is incident on the color filter of FIG. 2B at incident angles of 6 degrees, 12 degrees and 18 degrees, respectively.

As the incident angle becomes larger, the transmittance in the vicinity of 550 nm (green color) is decreased, whereas the transmittance in the vicinity of each of 450 nm (blue color) and 650 nm (red color) is increased.

The light which is transmitted through the photoelectric conversion portion 116 contains light whose incident angle is approximately 0 degrees to 18 degrees, and hence the color separation of the light which has reached the photoelectric conversion portion 116 cannot be sufficiently performed. As a result, the color reproduction characteristics of an image are deteriorated.

As described above, in the color filter 101 of this embodiment, the patterns 103 are arranged in the convex shape, whereby the range of the angle at which the light is incident on the color filter 101 can be reduced compared with the case where the color filter has the planar shape.

Therefore, the color separation characteristics can be improved, and the color reproduction characteristics of an image can also be improved. In addition, the film thickness of the color filter can be set to 100 nm, and hence it is possible to make thinner the color filter at the same time. It should be noted that, in this embodiment, the patterns are arranged in the two-dimensional pattern, but are not necessarily arranged in such a pattern. Alternatively, the patterns may be arranged in a one-dimensional pattern.

When the patterns are arranged in the one-dimensional pattern, the color filter exhibits anisotropy due to a difference in polarization of light.

Therefore, in a case of using the color filter as a filter layer utilizing the polarization of light, the patterns may be arranged in the one-dimensional pattern pattern.

On the other hand, a general image sensor is required to receive light without a polarization dependency of the incident light, and hence, in this embodiment, the arrangement in a two-dimensional pattern having a small polarization dependency is employed.

Further, when the patterns are arranged in a two-dimensional triangular lattice pattern, the symmetry in the color filter becomes higher, and the polarization dependency becomes smaller.

In addition, in this embodiment, the image sensor is formed such that the center of curvature 105 of the color filter 101 is matched with the focal position 130 of the microlens 110. However, the center of curvature 105 is not necessarily matched with the focal position 130, and may be located on the photoelectric conversion portion 116 side with respect to the color filter 101.

In this case, the angle formed between the direction of the incident light 122 and the surface normal at the light incident position on the color filter 101 is smaller compared with the case where the color filter has the planar shape.

As is apparent from the results shown in FIGS. 4B, 5A, 5B and 5C, as the angle formed between the incident light and the surface normal becomes smaller, changes in transmission spectrums of the perpendicular incidence and the oblique incidence are smaller.

Therefore, by making smaller the incident angle at which the light is brought incident on the color filter, the range of the angle at which the incident light 120 is brought incident on the color filter 101 can be made smaller. Therefore, the color separation characteristics of the incident light 120 are improved, and the color reproduction characteristics of an image are also improved.

In this embodiment, in the case of the incident angle of 6 degrees as shown in FIG. 5A, regarding the transmission spectrum shape, a light transmission characteristic of approximately 90% is obtained in the vicinity of the wavelength of 555 nm (green color), and a light transmission characteristic of approximately 20% is obtained in the vicinity of each of the wavelengths of 450 nm (blue color) and 650 nm (red color). Therefore, the color separation as the green color filter can be performed.

Therefore, when the incident angle is suppressed to approximately 6 degrees or smaller, the color filter having the excellent color separation characteristics can be provided.

The limit of the incident angle with respect to the color filter changes depending on design parameters or a shape of the color filter, and thus is appropriately decided according to the design.

It should be noted that, in this embodiment, the color filter 101 is formed on the insulating film 112 having the convex shape, but is not necessarily formed on the insulating film having the convex shape. Alternatively, the color filter having the convex shape which is formed by changing the thickness of the patterns 103 may be formed on an insulating film having a flat shape or a concave shape.

The convex shape of the insulating film having the convex shape is easily formed by performing etching or a reflow process to be described later.

Therefore, the color filter is formed on the insulating film having the convex shape by following the shape of this underlying layer, whereby the convex shape of the color filter can be easily formed. For this reason, it is more desirable to form the color filter 101 on the insulating film having the convex shape.

In addition, in this embodiment, the color filter 101 is formed above the wiring layer 114, but is not necessarily formed above the wiring layer 114. Alternatively, the color filter 101 may be formed between wiring layers.

Even when the color filter is formed between the wiring layers, the color reproduction characteristics can be similarly improved.

However, the distance between the color filter 101 and the microlens 110 becomes longer, so that the color separation is insufficient unless the radius of curvature of the color filter is made smaller. Accordingly, an effect of improving the color reproduction characteristics is deteriorated. It is difficult to form the convex shape with the small radius of curvature, and hence it is more desirable to form the color filter above the wiring layer.

In addition, in this embodiment, the BPSG film and silicon are used as the materials of the insulating film 102 and the patterns 103, respectively, but any materials may be used for the insulating film 102 and the patterns 103 as long as refractive indexes thereof are different from each other.

For example, an insulating film made of the BPSG film, silicon oxide, silicon nitride, titanium oxide or aluminum oxide may be used as the material of the insulating film 102. In addition, a semiconductor film made of silicon, amorphous silicon or polysilicon or a metal film made of aluminum, copper or tungsten may be used as the material of the patterns 103. It is desirable to use the materials as exemplified above, because the insulating film 102 and the patterns 103 can be easily formed by a film formation method described later.

The resonance spectrum of the sub-wavelength grating can be controlled by appropriately setting the refractive indexes, film thicknesses, filling factors and periods of the insulating film 102 and the patterns 103. As for the capability of the color filter, it is required to reduce the dead zone for higher light usage efficiency and to employ such a structure that the transmission spectrums of the color filters are different from each other for color separation.

Therefore, when the color filter using the sub-wavelength grating based on resonance is used, the half width of the resonance spectrum is preferably made larger.

Particularly when the absolute value of the difference between the refractive indexes of the patterns and a layer covering the patterns is set to 1.5 or larger, it is easy to make the half width of the resonance spectrum larger. Therefore, it is desirable that the difference between the refractive indexes be 1.5 or larger.

For example, in a case of a resonance mode which is generated in the vicinity of the wavelength of 650 nm in this embodiment, the difference between the refractive indexes of the patterns 103 and the insulating film 102 is approximately 2.3, and the half width of the resonance spectrum is approximately 50 nm.

In a case where the difference between the refractive indexes is set to 1.5 in the above-mentioned resonance mode under the condition that the effective refractive index is fixed, the half width becomes approximately 30 nm.

It should be noted that, in this embodiment, a dot array structure in which the refractive index of the patterns 103 is higher than that of the insulating film 102 is used. Alternatively, because any materials may be used for the insulating film 102 and the patterns 103 as long as the refractive indexes thereof are different from each other, a hole array structure in which the refractive index of the insulating film 102 is higher than that of the patterns 103 may be used.

Second Embodiment

Figure 6A:
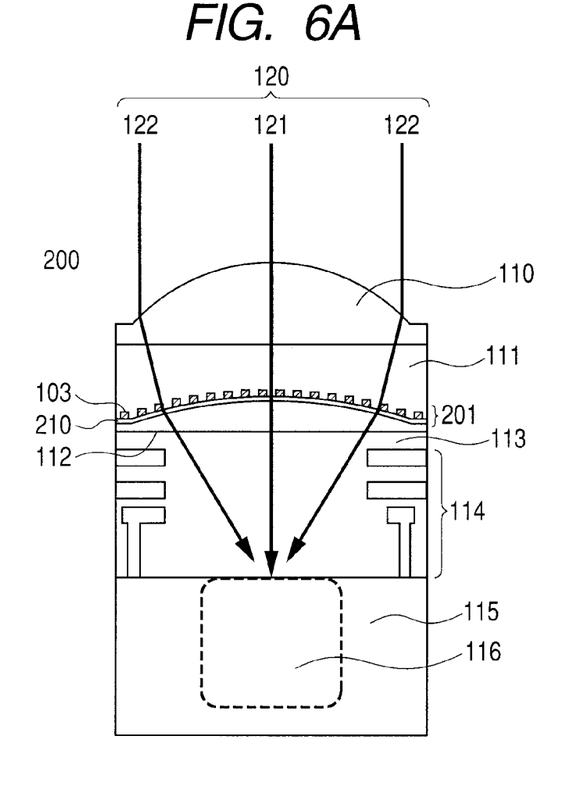
FIG. 6A is an explanatory cross sectional view illustrating an image sensor according to a second embodiment of the present invention.

With reference to FIG. 6A, an image sensor according to a second embodiment, to which the present invention is applied, is described.

In FIG. 6A, an image sensor 200 in this embodiment includes a color filter 201 and a thin insulating film 210.

The second embodiment is different from the first embodiment in that the design parameters of the color filter 201 are changed, and that the insulating film 112 having the convex shape is formed of silicon nitride and the thin insulating film 210 is formed of an insulating film such as a BPSG film on top of the insulating film 112.

The insulating film 112 having the convex shape is formed of a material having a refractive index higher than those of members around the insulating film 112, and thus serves as an inner layer lens.

The microlens 110 and the insulating film 112 having the convex shape are designed such that the incident light 120 forms an image on the surface of the photoelectric conversion portion 116.

The respective refractive indexes and the respective film thicknesses in this embodiment are shown in Table 3, and the respective radii of curvature are shown in Table 4.

The refractive index, film thickness and radius of curvature of the thin insulating film 210 are indicated by n6, d6 and r6, respectively. In addition, the patterns 103 are each formed of Si with a film thickness of 100 nm, and the values shown in FIG. 3B are used for the refractive index and the extinction coefficient of the patterns 103 respectively, similarly to the first embodiment.

TABLE 3

|  | Refractive Index |  | Film Thickness [μm] |
|---|---|---|---|
| n1 | 1.50 | d1 | 1.50 |
| n2 | 1.50 | d2 | 1.00 |
| n3 | 2.00 | d3 | 0.80 |
| n4 | 1.46 | d4 | 4.50 |
| n5 | 1.50 | d5 | 0.10 |
| n6 | 1.50 | d6 | 0.10 |

TABLE 4

| | Radius of Curvature [μm] |
|---|---|
| r1 | 3.51 |
| r2 | 5.42 |
| r5 | 5.62 |
| r6 | 5.52 |

Figure 6B:
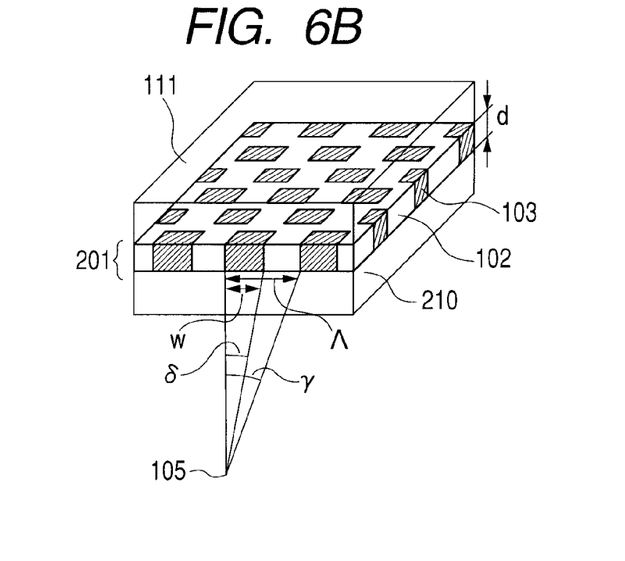
FIG. 6B is an explanatory view illustrating a structure of a color filter.

Next, with reference to FIG. 6B, the color filter 201 according to this embodiment is described.

The color filter 201 has such a structure that the patterns 103 are arranged within the insulating film 102 in a two-dimensional triangular lattice pattern. When the patterns are arranged in the two-dimensional triangular lattice pattern, the symmetry in the color filter becomes higher, and the polarization dependency becomes smaller.

In this embodiment, the period angle γ, the pattern width angle δ and the pattern thickness d are set to 0.0569 rad, 0.0231 rad and 100 nm, respectively, to thereby realize a complementary color filter for magenta.

In addition, because the radius of curvature of the color filter is set to 5.62 μm, the lattice period Λ and the pattern width w of the color filter are 320 nm and 130 nm, respectively, according to Expression (1) and Expression (2) described above.

Figure 7A:
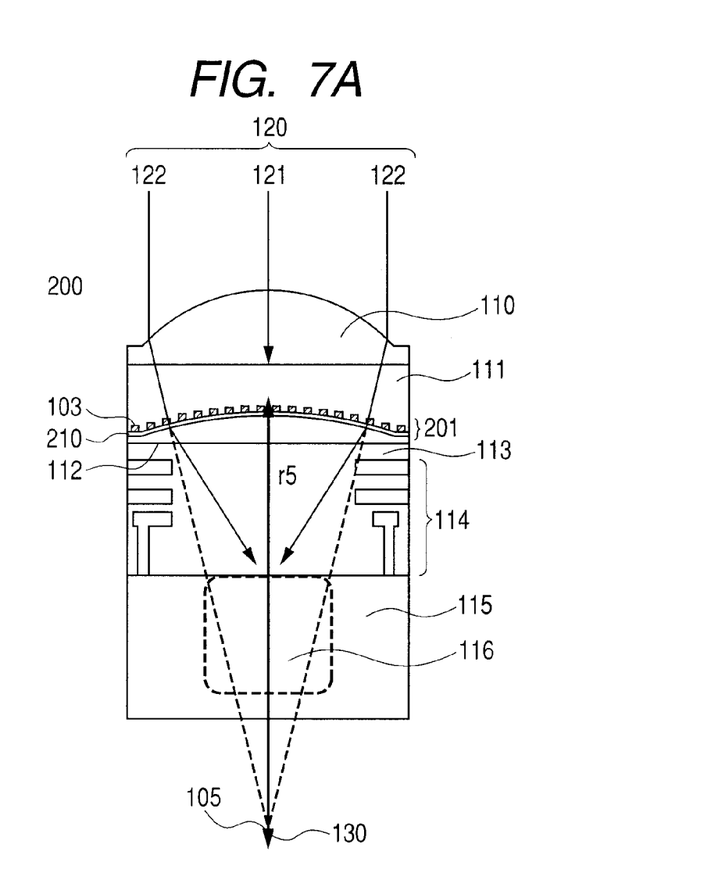
FIG. 7A is an explanatory cross sectional view illustrating the image sensor according to the second embodiment of the present invention.

In this embodiment, as illustrated in FIG. 7A, the center of curvature 105 of the color filter 201 is matched with the focal position 130 of the microlens 110.

Therefore, the direction of the incident light and the direction of the surface normal at the light incident position on the color filter 201 are matched with each other, so that the incident light 120 is perpendicularly incident on the color filter 201.

Figure 7B:
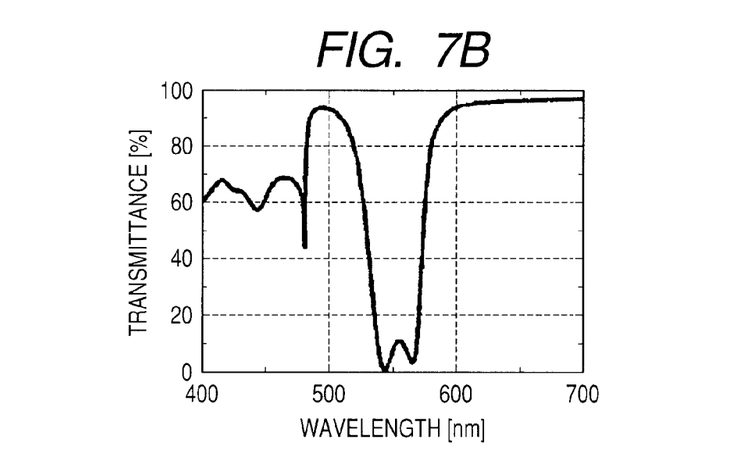
FIG. 7B is a graph showing a transmission spectrum of the color filter.

In this case, as illustrated in FIG. 7B, a light transmission characteristic of 10% or lower is obtained in the vicinity of the wavelength of 555 nm (green color), a light transmission characteristic of 60% or higher is obtained in the vicinity of the wavelength of 450 nm (blue color), and a light transmission characteristic of 90% or higher is obtained in the vicinity of the wavelength of 650 nm (red color).

Therefore, the color separation as the complementary color filter for magenta can be performed.

Here, the case where the color filter 201 of the present invention is structured to have a planar shape as in the above-mentioned conventional example is discussed.

In this structure, the incident light which is refracted by the microlens 110 is obliquely incident on the color filter.

As a result of ray tracing, for example, the light which is incident on the microlens 110 at a position 2.5 μm away from the center of the pixel is then incident on the color filter at an angle of 13.6 degrees and a position 1.91 μm away with respect to the central axis of the color filter.

In addition, the light which is incident on the microlens 110 at a position 1.5 μm away from the center of the pixel is then incident on the color filter at an angle of 8.17 degrees and a position 1.14 μm away with respect to the central axis of the color filter.

In addition, the light which is incident on the microlens 110 at a position 0.5 μm away from the center of the pixel is then incident on the color filter at an angle of 2.72 degrees and a position 0.381 μm away with respect to the central axis of the color filter.

Figure 8A:
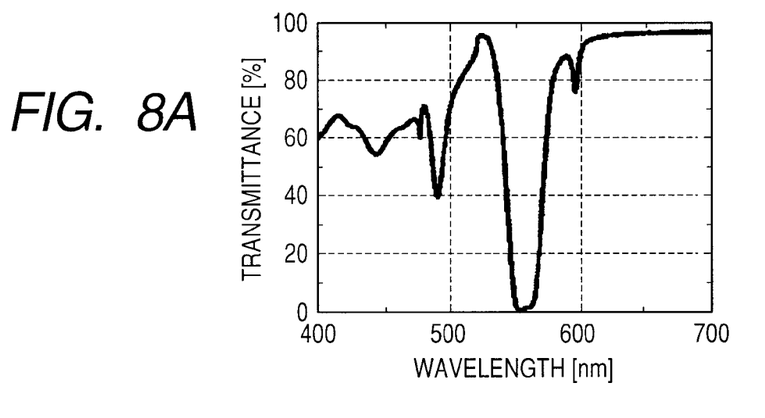
FIGS. 8A, 8B and 8C are graphs each showing the transmission spectrum of the color filter according to the second embodiment of the present invention.
Figure 8B:
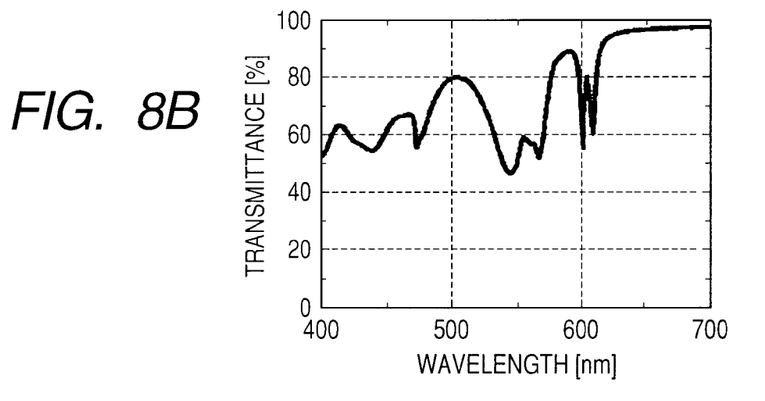
Figure 8C:
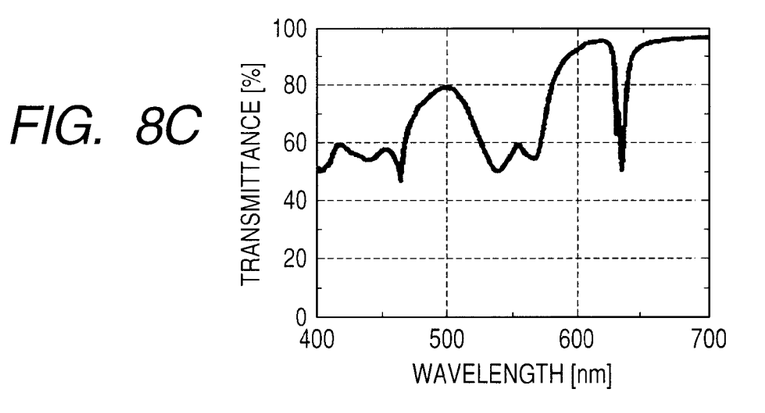

FIGS. 8A, 8B and 8C show the transmission spectrums when light is incident on the color filter of FIG. 6B at incident angles of 5 degrees, 10 degrees and 15 degrees, respectively.

As the incident angle becomes larger, the transmittance in the vicinity of the wavelength of 550 nm (green color) is increased, and a valley in the transmittance newly appears in the vicinity of the wavelength of 650 nm (red color). The light which is transmitted through the photoelectric conversion portion 116 contains light whose incident angle is approximately 0 degrees to 15 degrees, and hence the color separation of the light which has reached the photoelectric conversion portion 116 cannot be sufficiently performed. As a result, the color reproduction characteristics of an image are deteriorated.

As described above, the color separation characteristics are improved by using the color filter 201 of this embodiment, whereby the color reproduction characteristics of an image are also improved. In addition, the film thickness of the color filter can be set to 100 nm, and hence it is possible to make thinner the color filter at the same time.

It should be noted that, in this embodiment, the insulating film 112 having the convex shape is used as the inner layer lens and formed on the photoelectric conversion portion side with respect to the color filter 201, but this structure is not necessarily employed.

Even with a structure in which the inner layer lens is provided above the color filter, the color reproduction characteristics can be similarly improved.

However, the incident angle at which the incident light is incident on the color filter is further increased by the inner layer lens, and hence the color separation is insufficient unless the radius of curvature of the color filter is made smaller. Accordingly, the effect of improving the color reproduction characteristics is deteriorated.

It is difficult to form the color filter having the small radius of curvature, and hence it is more desirable to form the inner layer lens on the photoelectric conversion portion side with respect to the color filter.

In addition, the use of the inner layer lens can reduce the refractive power of the microlens, which can thus make smaller the incident angle with respect to the color filter. Therefore, it is desirable to use the inner layer lens.

In addition, in this embodiment, the insulating film 112 having the convex shape is formed as the inner layer lens, but the insulating film having the convex shape is not necessarily formed as the inner layer lens.

However, as described later, the number of steps required for a process of forming the convex shape is larger than that of a process of forming films.

Accordingly, in order to reduce the number of steps required for the process of forming the convex shape, the insulating film having the convex shape, which is an underlying layer of the color filter, is provided as the inner layer lens with a light focusing function, whereby a process of newly forming the inner layer lens can be omitted.

Therefore, it is more desirable to form the insulating film 112 having the convex shape as the inner layer lens.

Third Embodiment

FIGS. 9A, 9B, 9C, 9D, 9E and 9F are explanatory views illustrating a manufacturing process for the image sensor according to the present invention.

Figure 9A:
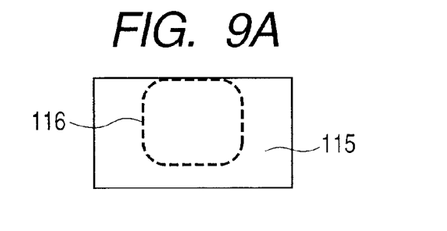
FIGS. 9A, 9B, 9C, 9D, 9E and 9F are explanatory cross sectional views illustrating a production of an image sensor according to a third embodiment of the present invention.

A silicon oxide film is formed on a surface of the silicon substrate 115 by thermal oxidation (not shown).

Subsequently, in order to form the photoelectric conversion portion 116 within the silicon substrate 115, a resist mask is formed at a predetermined position by using a photoresist, and then impurities are ion-implanted. After that, the resist mask is removed by asking or the like (FIG. 9A).

Further, in order to form a gate electrode for transferring electric charges generated in the photoelectric conversion portion 116, a polysilicon film is formed.

Then, a photolithography step is performed to etch the polysilicon film into a predetermined pattern, whereby the gate electrode is formed (not shown).

After that, for example, an $SiO_2$-based interlayer insulating film is formed on the silicon substrate 115 and the gate electrode.

Further, for the purpose of electrical connection, a connection hole such as a contact hole is formed in the interlayer insulating film to form electrical connection to other metal wiring layers.

Figure 9B:
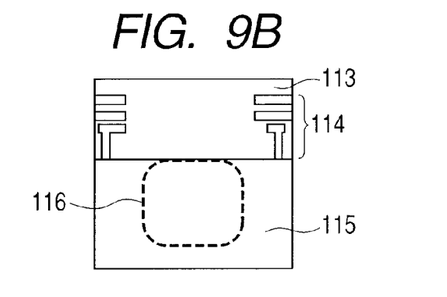

Similarly, a first wiring layer, a second wiring layer and a third wiring layer, which constitute the wiring layer 114, are respectively formed, and the wiring layer 114 is covered by the interlayer insulating film 113 (FIG. 9B).

Figure 9C:
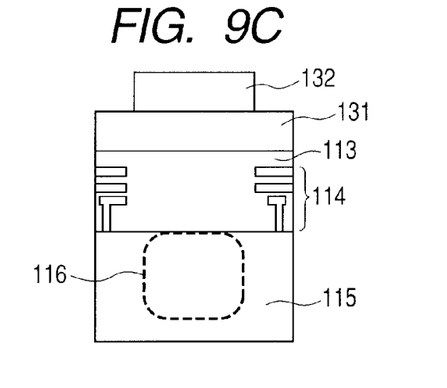
Figure 9D:
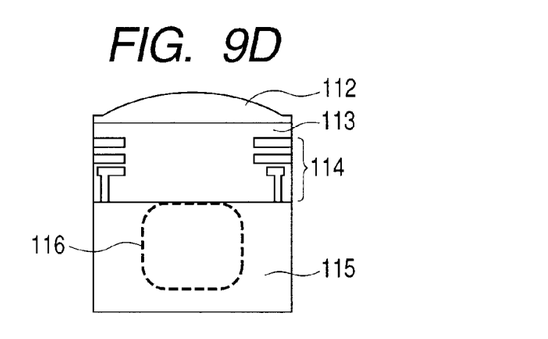

Subsequently, an insulating film 131 for forming the insulating film 112 having the convex shape is formed. A resist film 132 is formed by the photolithography step as illustrated in FIG. 9C. Then, isotropic etching is performed with the resist film 132 being used as a mask, and the reflow process is performed. As a result, the insulating film 112 having the convex shape is formed (FIG. 9D).

Further, an insulating film is formed if necessarily (not shown).

Figure 9E:
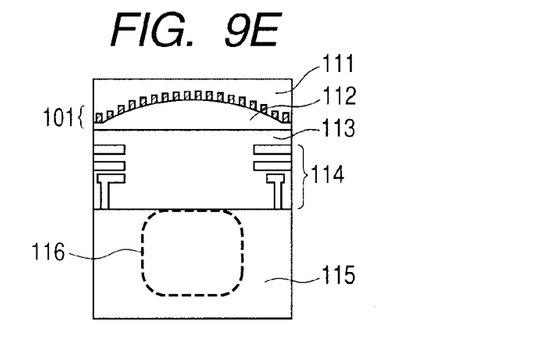

Subsequently, a film made of the material of the patterns 103, for example, an Si film is formed by a CVD method or the like. A resist film is formed by the photolithography step, and etching is performed with the resist film being used as a mask.

After that, an insulating film is formed, and then planarization is performed by a CMP method (FIG. 9E).

Figure 9F:
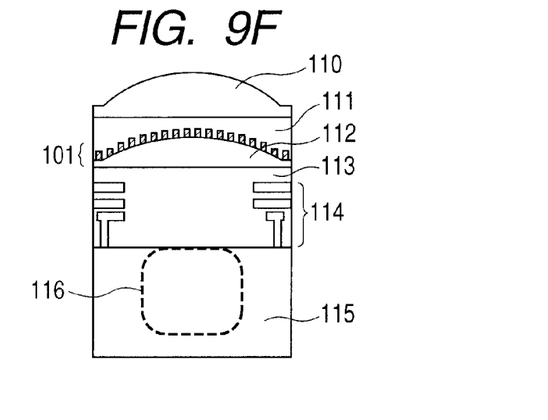

Further, the microlens 110 is formed by a known resist reflow method (FIG. 9F).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-095476, filed Apr. 10, 2009, which is hereby incorporated by reference herein in its entirety.

What is claimed is:

1. An image sensor comprising:
   an photoelectric conversion portion;
   a microlens; and
   a filter layer between the photoelectric conversion portion and the microlens,
   wherein the filter layer has a convex shape having a center of curvature on a side of the photoelectric conversion portion with respect to the filter layer and includes patterns that are arranged in a one-dimensional or two-dimensional period such that an angle from the center of curvature is fixed, and
   wherein the center of curvature and a focal position of the microlens are matched with each other.

2. The image sensor according to claim 1, further comprising an insulating film having a convex shape with respect to incident light between the microlens and the photoelectric conversion portion, wherein the filter layer is formed on the insulating film.

3. The image sensor according to claim 1, further comprising an inner layer lens formed on the side of the photoelectric conversion portion with respect to the filter layer.

4. The image sensor according to claim 3, wherein the inner layer lens is formed of the insulating film.

5. The image sensor according to claim 1, further comprising a wiring layer, wherein the filter layer is provided on a light incident side with respect to the wiring layer.

6. The image sensor according to claim 1, wherein the filter layer is formed of the patterns and a layer covering the patterns, and wherein an absolute value of a difference between refractive indexes of the patterns and the layer covering the patterns is 1.5 or larger.

7. An image sensor comprising:
   an photoelectric conversion portion;
   a microlens; and
   a filter layer between the photoelectric conversion portion and the microlens,
   wherein the filter layer has a convex shape having a center of curvature on a side of the photoelectric conversion portion with respect to the filter layer and includes patterns that are arranged in a one-dimensional or two-dimensional period such that an angle from the center of curvature is fixed, and
   wherein the patterns are arranged in a two-dimensional triangular lattice pattern.

8. An image sensor comprising:
   an photoelectric conversion portion;
   a microlens; and
   a filter layer between the photoelectric conversion portion and the microlens,
   wherein the filter layer has a convex shape having a center of curvature on a side of the photoelectric conversion portion with respect to the filter layer and includes patterns that are arranged in a one-dimensional or two-dimensional period such that an angle from the center of curvature is fixed, and
   wherein the image sensor comprises a plurality of the photoelectric conversion portions, corresponding a plurality of the microlenses and corresponding a plurality of the filter layers and wherein each filter layer has the center of curvature individually corresponding to each photoelectric conversion portion.

\* \* \* \* \*